(12) United States Patent
Chung et al.

(10) Patent No.: US 11,030,040 B2
(45) Date of Patent: *Jun. 8, 2021

(54) MEMORY DEVICE DETECTING AN ERROR IN WRITE DATA DURING A WRITE OPERATION, MEMORY SYSTEM INCLUDING THE SAME, AND OPERATING METHOD OF MEMORY SYSTEM

(71) Applicant: SK hynix Inc., Gyeonggi-do (KR)

(72) Inventors: Hoiju Chung, San Jose, CA (US); Young-Do Hur, Chungcheongbuk-do (KR); Hyuk Lee, Gyeonggi-do (KR); Jang-Ryul Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 126 days.

This patent is subject to a terminal disclaimer.

(21) Appl. No.: 16/027,767

(22) Filed: Jul. 5, 2018

(65) Prior Publication Data

US 2019/0012230 A1 Jan. 10, 2019

Related U.S. Application Data

(60) Provisional application No. 62/644,149, filed on Mar. 16, 2018, provisional application No. 62/528,849, filed on Jul. 5, 2017.

(51) Int. Cl.
*G06F 11/10* (2006.01)
*G06F 11/00* (2006.01)
*G06F 3/06* (2006.01)
*G06F 3/00* (2006.01)
*G11C 29/52* (2006.01)
*G11C 29/04* (2006.01)

(52) U.S. Cl.
CPC ........ *G06F 11/1068* (2013.01); *G06F 3/0619* (2013.01); *G06F 3/0659* (2013.01); *G06F 3/0673* (2013.01); *G06F 11/1004* (2013.01); *G06F 11/1048* (2013.01); *G11C 29/52* (2013.01); *G11C 2029/0411* (2013.01)

(58) Field of Classification Search
None
See application file for complete search history.

(56) References Cited

U.S. PATENT DOCUMENTS

| | | | | |
|---|---|---|---|---|
| 6,898,036 | B2* | 5/2005 | Gill | G11B 5/584 360/31 |
| 8,042,023 | B2 | 10/2011 | Balb | |
| 9,965,352 | B2* | 5/2018 | Suh | G06F 11/1048 |
| 10,140,175 | B2* | 11/2018 | West | G06F 3/0619 |
| 10,204,008 | B2* | 2/2019 | Trezise | G11C 5/04 |
| 10,417,091 | B2* | 9/2019 | Lesartre | G06F 3/0619 |
| 2010/0005366 | A1* | 1/2010 | Dell | G06F 11/073 714/758 |
| 2011/0231737 | A1* | 9/2011 | Dachiku | G06F 11/1044 714/770 |
| 2012/0266041 | A1* | 10/2012 | Wang | G06F 11/10 714/752 |

(Continued)

*Primary Examiner* — Justin R Knapp
(74) *Attorney, Agent, or Firm* — IP & T Group LLP

(57) ABSTRACT

A memory device includes a write error check circuit suitable for detecting an error in received data using an error correction code during a write operation; and a memory core suitable for storing the received data and the received error correction code when no error is detected by the write error check circuit.

19 Claims, 11 Drawing Sheets

(56) References Cited

U.S. PATENT DOCUMENTS

2015/0378823 A1* 12/2015 Lesartre .............. G06F 11/1048
714/764
2018/0024897 A1* 1/2018 Cai ........................ G06F 11/18
714/6.12

* cited by examiner

MEMORY DEVICE DETECTING AN ERROR IN WRITE DATA DURING A WRITE OPERATION, MEMORY SYSTEM INCLUDING THE SAME, AND OPERATING METHOD OF MEMORY SYSTEM

CROSS-REFERENCE TO RELATED APPLICATIONS

This application claims the benefit of U.S. Provisional Application No. 62/528,849, filed on Jul. 5, 2017, and U.S. Provisional Application No. 62/644,149, filed on Mar. 16, 2018, the entire contents of which are incorporated herein by reference.

BACKGROUND

1. Field

Various embodiments of the present invention relate to a memory device, a memory system including the same, and a method of operating a memory system.

2. Discussion of the Related Art

In the past, the semiconductor memory industry was able to regularly produce a number of original good dies, each of which having no failed memory cell, on a wafer by a semiconductor fabrication process. The original good dies were recognizable when inspected after the semiconductor fabrication process. However, as the density of a memory device has gradually increased, it has become substantially more difficult to fabricate a memory device which has no failed memory cell, and presently, it may be unlikely that such an error-free memory device can be fabricated. One way to overcome this situation is to repair failed memory cells of a memory device by using redundant memory cells.

Another way is to correct an error in a memory cell and another error that occurred while data is transmitted in the read and write processes of a memory system using an error correction circuit (ECC circuit).

SUMMARY

Various embodiments are directed to providing a technology capable of enhancing or improving error correction efficiency in a memory system.

In an embodiment, a memory device may include: a write error check circuit suitable for detecting an error in received data using a received error correction code during a write operation; and a memory core suitable for storing the received data and the received error correction code when no error is detected by the write error check circuit.

In an embodiment, a memory system including a memory device and a memory controller may be provided, the memory device including: a write error check circuit suitable for detecting an error in data, received from the memory controller using an error correction code received from the memory controller during a write operation; and a memory core suitable for storing the received data and the received error correction code when no error is detected by the write error check circuit, the memory controller including: an error correction code generation circuit suitable for generating the error correction code to be transferred to the memory device using the data to be transferred to the memory device; and an error correction circuit suitable for correcting, when an error is present in data transferred from the memory device, the error in the data transferred using an error correction code transferred from the memory device.

In an embodiment, a method for operating a memory system may include: generating, by a memory controller, an error correction code using write data; transferring a write command, the write data, and the error correction code to a memory device from the memory controller; detecting, by the memory device, an error in the write data using the error correction code; and storing, when no error in the write data is detected, the write data and the error correction code in a memory core of the memory device.

DETAILED DESCRIPTION

Figure 1:
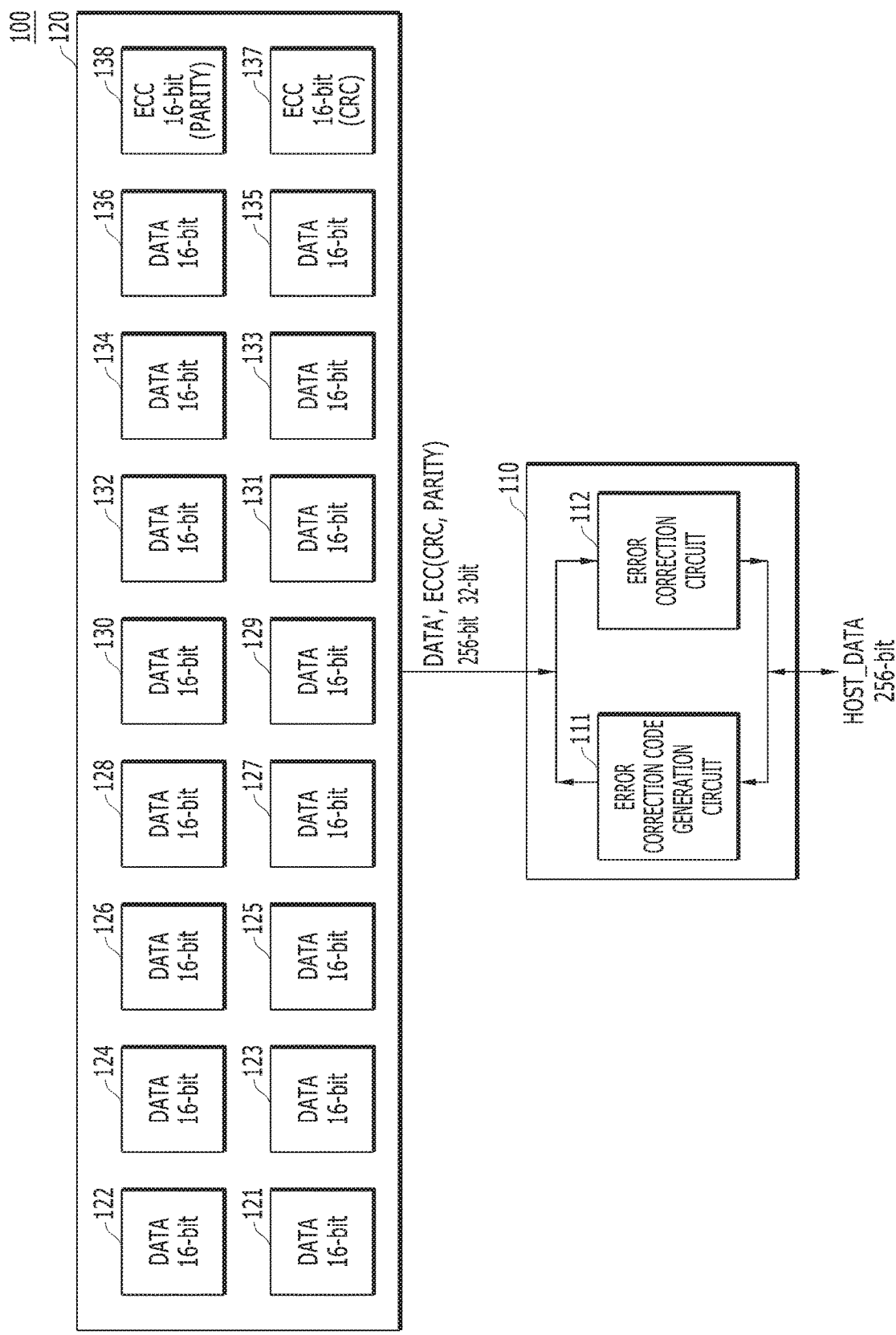
FIG. 1 is a diagram illustrating a configuration of a memory system 100 in accordance with an embodiment.

Various embodiments will be described below in more detail with reference to the accompanying drawings. The present invention may, however, be embodied in different forms and thus is not limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the disclosure, reference to "an embodiment" or the like is not necessarily to only one embodiment, and different references to "an embodiment" or the like are not necessarily to the same embodiment(s).

The drawings are not necessarily to scale, and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a diagram illustrating a configuration of a memory system 100 in accordance with an embodiment. In FIG. 1, only components directly associated with storage of data and error correction of data in the memory system 100 are shown.

Referring to FIG. 1, the memory system 100 may include a memory controller 110 and a memory module 120.

The memory controller 110 may control the read and write operations of the memory module 120 depending on, and in response to, a request of a host. The memory controller 110 may include an error correction code generation circuit 111 for generating an error correction code ECC in the write operation and an error correction circuit 112 for correcting an error of data DATA by using the error correction code ECC in the read operation.

The error correction code generation circuit 111 may generate the error correction code ECC for correcting an error by using data HOST_DATA transferred from the host, in the write operation. By way of example, the unit of data, that is, unit of data word, to be processed in a single write operation is 256 bits. In this case, the error correction code generation circuit 111 may generate the error correction code ECC of 32 bits by using the data HOST_DATA of 256 bits. In the error correction code ECC, 16 bits may be a CRC (cyclic redundancy check) code for the data HOST_DATA of 256 bits, and the remaining 16 bits may be a simple parity code for the data HOST_DATA of 256 bits and the CRC code of 16 bits. In the write operation, since the error correction code ECC is generated but an error correction operation is not performed, the data HOST_DATA transferred from the host and the data DATA transferred from the memory controller 110 to the memory module 120 may be the same. A codeword may represent both the data DATA and the error correction code ECC. The codeword of 288 bits may be divided into 18 symbols. When one symbol is 16 bits, the data DATA of 256 bits may be divided into 16 symbols. The error correction code ECC of 32 bits may be divided into the CRC code of one symbol and the simple parity code of one symbol. The CRC code may be, concretely, a CRC-16 code. The simple parity code may be generated through a logical XOR operation, i.e., XORing, by unit of symbol, the remaining symbols except the simple parity code in the entire codeword.

The error correction circuit 112 may cure or correct an error of the data DATA transferred from the memory module 120, by using the error correction code ECC transferred from the memory module 120, in the read operation. The error correction circuit 112 may correct an error of the data DATA in a manner of detecting the error by using the CRC code and restoring a symbol by using the simple parity code. An error correction operation may be repeated until an error is not detected. By way of example, when the presence of an error is detected through a CRC calculation using the CRC code, a first symbol may be restored through a parity calculation using the parity code, in which case it is assumed that an error is present in the first symbol. When the presence of an error is detected through a CRC calculation using the CRC code with the first symbol restored, a second symbol is restored through a parity calculation using the parity code, in which case it is assumed that an error is present in the second symbol. When the presence of an error is detected through a CRC calculation using the CRC code with the second symbol restored, a third symbol is restored through a parity calculation using the parity code in which case it is assumed that an error is present in the third symbol. When the presence of an error is detected through a CRC calculation using the CRC code with the third symbol restored, a fourth symbol is restored through a parity calculation using the parity code, in which case it is assumed that an error is present in the fourth symbol. These operations may be repeated until an error is not detected. In this way, the error correction circuit 112 may correct or cure an error of one symbol.

The memory module 120 may include 18 memory devices 121 to 138. Each of the memory devices 121 to 138 may be one of all kinds of memories such as a DRAM (dynamic random access memory), a PCRAM (phase change random access memory) and a flash memory. The memory module 120 may be a DIMM (dual in-line memory module) type. Portions of the codeword of 288 bits may be stored in all 18 memory devices 121 to 138. The codeword of 288 bits may include the data DATA of 256 bits and the error correction code ECC of 32 bits, that is, the codeword of 18 symbols. The 18 symbols configuring the codeword may be written, one symbol by one symbol, in the 18 memory devices 121 to 138, respectively, during a single write operation. The total 18 symbols may be read, one symbol by one symbol, from the 18 memory devices 121 to 138, respectively, during a single read operation. In each of the memory devices 121 to 138, the codeword which is stored by a corresponding memory device is shown. For example, the memory device 123 may store one data symbol of 16 bits, and another memory device 137 may store one ECC symbol of 16 bits (the CRC code of the error correction code ECC).

Figure 2:
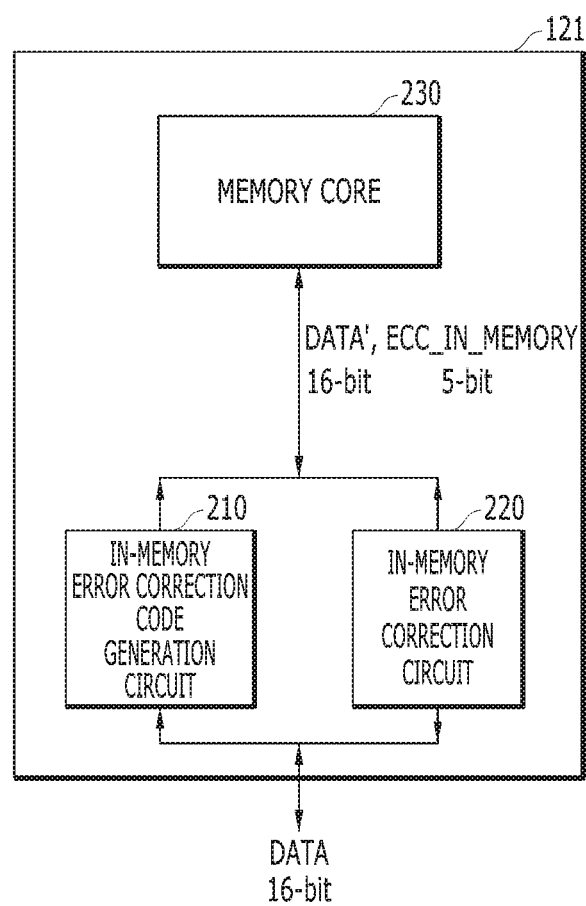
FIG. 2 is a diagram illustrating a configuration of the memory device 121 shown in FIG. 1.

FIG. 2 is a diagram illustrating a configuration of the memory device 121 shown in FIG. 1. In FIG. 2, only components directly associated with storage of data and error correction of data in the memory device 121 are shown for clarity. The other memory devices 122 to 138 of FIG. 1 may be configured as shown in FIG. 2.

Referring to FIG. 2, the memory device 121 may include an in-memory error correction code generation circuit 210, an in-memory error correction circuit 220 and a memory core 230.

The in-memory error correction code generation circuit 210 may generate an in-memory error correction code ECC_IN_MEMORY for correcting an error, by using the data DATA received by the memory device 121. For example, the in-memory error correction code generation circuit 210 may use the data DATA of 16 bits to generate the in-memory error correction code ECC_IN_MEMORY of five bits, which is used for correcting an error of the data DATA. The in-memory error correction code ECC_IN_MEMORY may include a Hamming code. In the write operation, since the error correction operation is not performed, the data DATA received by the memory device 121 and data DATA' transferred to the memory core 230 may be the same.

The memory core 230 may store the data DATA' and the in-memory error correction code ECC_IN_MEMORY in the memory device 121. The memory core 230 may include a plurality of cell arrays and circuits for writing the data DATA' and the in-memory error correction code ECC_IN_MEMORY in the plurality of cell arrays and reading the data DATA' and the in-memory error correction code ECC_IN_MEMORY from the plurality of cell arrays. In the write operation, the data DATA' received by the memory device 121 and the in-memory error correction code ECC_IN_MEMORY generated in the in-memory error correction code generation circuit 210 may be written in the memory core 230. In the read operation, the data DATA' and the in-memory error correction code ECC_IN_MEMORY may be read from the memory core 230.

The in-memory error correction circuit 220 may correct an error of the data DATA' read from the memory core 230, by using the in-memory error correction code ECC_IN_

MEMORY read from the memory core 230. The data DATA in which an error is corrected by the in-memory error correction circuit 220 may be transmitted from the memory device 121 to the memory controller 110. The in-memory error correction circuit 220 may generally correct an error of one bit which has occurred in the memory device 121.

The circuits 210, 220 for in-memory error correction are to perform the error correction operation of the memory device 121 itself. The error correction operation may be performed in a state in which it is hidden to the memory controller 110. That is to say, the memory controller 110 may not be aware that the additional in-memory error correction code ECC_IN_MEMORY is stored in the memory device 121. Also, the memory controller 110 may not be aware that the in-memory error correction operation is performed internally of the memory device 121.

Since the error correction operation of the in-memory error correction circuit 220 should be performed within a short time, its error correction capability is relatively small. For example, the in-memory error correction circuit 220 may correct only an error of one bit. In the case where errors exceeding the error correction capability of the in-memory error correction circuit 220 occur, such errors may instead increase as a result of a malfunction. For example, in the case where errors of two bits occur, the in-memory error correction circuit 220 may not correct the errors and may increase errors to three bits.

Even when errors exceed the error correction capability of the in-memory error correction circuit 220 and thus increase by a malfunction, no problem may be caused in the operation of the memory system 100. Because the memory device 121 only stores one symbol of the entire codeword configured by 18 symbols, even when errors increase as a result of the in-memory error correction circuit 220, the increased errors are present only in one symbol in the entire codeword and may be corrected by the error correction circuit 112 of the memory controller 110.

Figure 3:
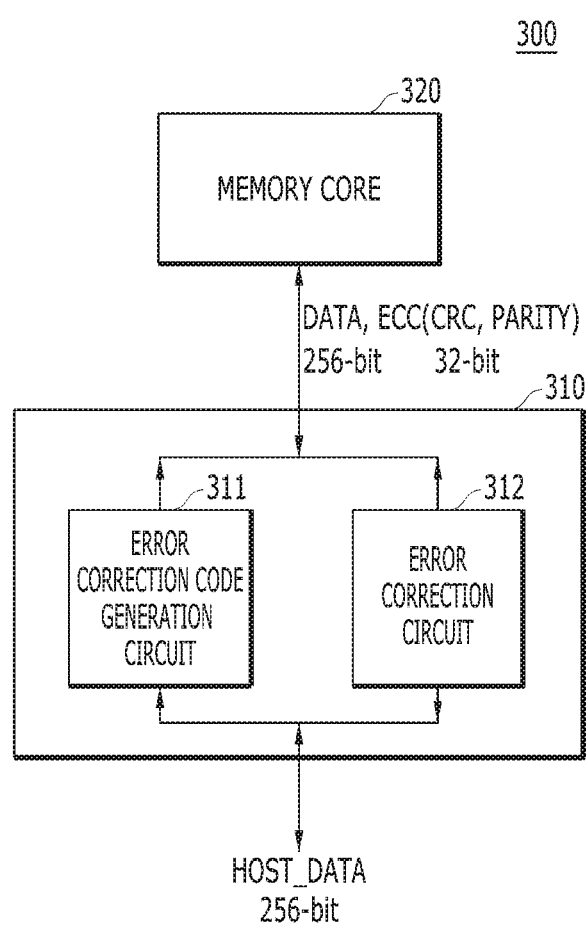
FIG. 3 is a diagram illustrating a configuration of a memory system 300 in accordance with another embodiment.

FIG. 3 is a diagram illustrating a configuration of a memory system 300 in accordance with another embodiment. In FIG. 3, only components directly associated with storage of data and error correction of data in the memory system 300 are shown.

Referring to FIG. 3, the memory system 300 may include a memory controller 310 and a memory device 320.

The memory controller 310 may control the read and write operations of the memory device 320 depending on a request of a host. The memory controller 310 may include an error correction code generation circuit 311 for generating an error correction code ECC in the write operation and an error correction circuit 312 for correcting an error of data DATA by using the error correction code ECC in the read operation.

The error correction code generation circuit 311 may generate the error correction code ECC for correcting an error, by using data HOST_DATA transferred from the host, in the write operation. It is illustrated as an example that unit of data, that is, unit of data word, to be processed in a single write operation is 256 bits. In this case, the error correction code generation circuit 311 may generate the error correction code ECC of 32 bits by using the data HOST_DATA of 256 bits. In the error correction code ECC, 16 bits may be a CRC (cyclic redundancy check) code for the data HOST_DATA of 256 bits, and the remaining 16 bits may be a simple parity code for the data HOST_DATA of 256 bits and the CRC code of 16 bits. In the write operation, since the error correction code ECC is generated but an error correction operation is not performed, the data HOST_DATA transferred from the host and the data DATA transferred from the memory controller 310 to the memory device 320 may be the same. A codeword may represent both the data DATA and the error correction code ECC. The codeword of 288 bits may be divided into 18 symbols. For example, when one symbol is 16 bits, the data DATA of 256 bits may be divided into 16 symbols. The error correction code ECC of 32 bits may be divided into the CRC code of one symbol and the simple parity code of one symbol. The CRC code may be a CRC-16 code. The simple parity code may be generated through a logical XOR operation, i.e., XORing, by unit of symbol, the remaining symbols except the simple parity code in the entire codeword.

The error correction circuit 312 may cure or correct an error of the data DATA transferred from the memory device 320, by using the error correction code ECC transferred from the memory device 320, in the read operation. The error correction circuit 312 may correct an error of the data DATA in a manner of detecting the error by using the CRC code and restoring a symbol by using the simple parity code. Operations that may be performed and repeated until an error is not detected include an operation in which the presence of an error is detected through a CRC calculation using the CRC code and a first symbol is restored through a parity calculation using the parity code when it is assumed that an error is present in the first symbol, an operation in which the presence of an error is detected through a CRC calculation using the CRC code with the first symbol restored and a second symbol is restored through a parity calculation using the parity code when it is assumed that an error is present in the second symbol, an operation in which the presence of an error is detected through a CRC calculation using the CRC code with the second symbol restored and a third symbol is restored through a parity calculation using the parity code when it is assumed that an error is present in the third symbol, and an operation in which the presence of an error is detected through a CRC calculation using the CRC code with the third symbol restored and a fourth symbol is restored through a parity calculation using the parity code when it is assumed that an error is present in the fourth symbol. In this way, the error correction circuit 312 may correct an error of one symbol.

The memory device 320 may store the entirety of the codeword of 288 bits including the data DATA and the error correction code ECC, that is, the codeword of 18 symbols. The entirety of the 18 symbols configuring the codeword may be stored in the memory device 320 in one write operation. The entirety of the 18 symbols may be read from the memory device 320 in one read operation. The memory device 320 may be a high bandwidth memory (HBM). In addition to having a higher than usual bandwidth, the HBM also has a higher than usual density. The HBM is configured in that memory chips are stacked based on a 3D-TSV technology, and an increased number of data pins are disposed to increase I/O bandwidth. In the case of the HBM, an entire codeword corresponding to one write command may be written in one memory device in a write operation, and an entire codeword corresponding to one read command may be read from one memory device in a read operation. In the memory system 300 of FIG. 3, an entire codeword is written in one memory device 320, and an entire codeword is read from one memory device 320. Besides the HBM, other kinds of memories may be used as the memory device 320 of the memory system 300 so long as they satisfy such a condition.

Figure 4:
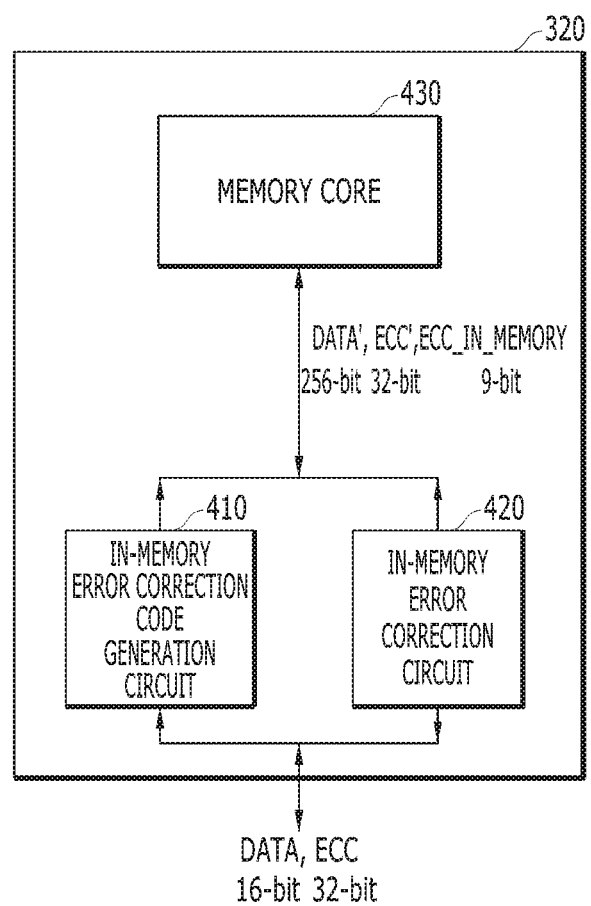
FIG. 4 is a diagram illustrating a configuration of the memory device 320 shown in FIG. 3.

FIG. 4 is a diagram illustrating a configuration of the memory device 320 shown in FIG. 3. In FIG. 4, only components directly associated with storage of data and error correction of data in the memory device 320 are shown.

Referring to FIG. 4, the memory device 320 may include an in-memory error correction code generation circuit 410, an in-memory error correction circuit 420 and a memory core 430.

The in-memory error correction code generation circuit 410 may generate an in-memory error correction code ECC_IN_MEMORY for correcting an error of the data DATA and the error correction code ECC, by using the data DATA and the error correction code ECC received by the memory device 320. For example, the in-memory error correction code generation circuit 410 may use the data DATA of 256 bits and the error correction code ECC of 32 bits, that is, a message of a total of 288 bits, to generate the in-memory error correction code ECC_IN_MEMORY of nine bits. The in-memory error correction code ECC_IN_MEMORY may include a Hamming code. In the write operation, since the error correction operation is not performed, the data DATA and the error correction code ECC received by the memory device 320 may be the same as data DATA' and an error correction code ECC' transferred to the memory core 430.

The memory core 430 may store the data DATA', the error correction code ECC' and the in-memory error correction code ECC_IN_MEMORY in the memory device 320. The memory core 430 may include a plurality of cell arrays and circuits for writing the data DATA', the error correction code ECC', and the in-memory error correction code ECC_IN_MEMORY in the plurality of cell arrays, and for reading the data DATA', the error correction code KC', and the in-memory error correction code ECC_IN_MEMORY from the plurality of cell arrays.

The in-memory error correction circuit 420 may correct an error of the data DATA' and error correction code ECC' read from the memory core 430, by using the in-memory error correction code ECC_IN_MEMORY read from the memory core 430. The data DATA and error correction code ECC in which an error is corrected by the in-memory error correction circuit 420 may be transmitted from the memory device 320 to the memory controller 310. The in-memory error correction circuit 420 may correct an error of one bit which has occurred in the memory device 320.

The circuits 410, 420 for in-memory error correction are to perform the error correction operation of the memory device 320 itself. The error correction operation may be performed in a state in which it is hidden to the memory controller 310. That is to say, the memory controller 310 may not be aware that the additional in-memory error correction code ECC_IN_MEMORY is stored in the memory device 320, and may not be aware that the in-memory error correction operation is performed internally of the memory device 320.

Since the error correction operation of the in-memory error correction circuit 420 should be performed within a short time, its error correction capability may be relatively small. For example, the in-memory error correction circuit 420 may correct only an error of one bit. In the case where errors exceeding the error correction capability of the in-memory error correction circuit 420 occur, such errors may instead increase by a malfunction. For example, in the case where errors of two bits occur, the in-memory error correction circuit 420 may not correct the errors and may increase errors to three bits.

Unlike the memory system 200 of FIGS. 1 and 2, in the memory system 300 of FIGS. 3 and 4, the malfunction of the in-memory error correction circuit 420 may cause a problem, as described below with reference to FIGS. 5A and 5B.

Figure 5A:
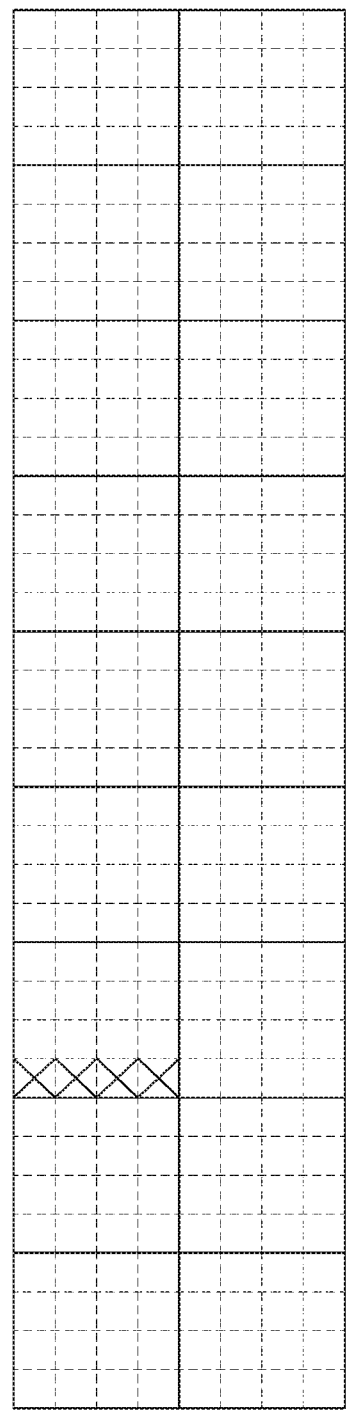
FIGS. 5A and 5B are diagrams describing an operation of an in-memory error correction circuit 420.

FIG. 5A shows the data DATA' and error correction code ECC of 288 bits read from the memory core 430 of the memory device 320 of the memory system 300. The 18 sections partitioned by solid lines may represent 18 symbols respectively, and the 16 subsections partitioned by dotted lines in each of the sections represent data of 16 bits in a corresponding symbol, each of the subsections representing one bit. The four bits denoted by X in the drawing may represent error bits. Referring to FIG. 5A, it may be seen that errors of four bits are included in one symbol.

Figure 5B:
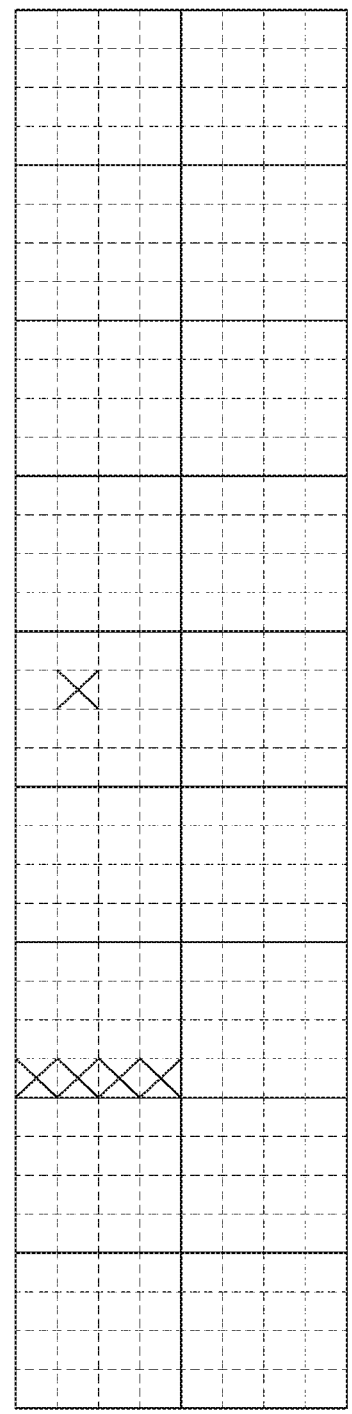

FIG. 5B shows the data DATA and the error correction code ECC after the in-memory error correction circuit 420 performs the error correction operation for the data DATA' and the error correction code ECC' by using the in-memory error correction code ECC_IN_MEMORY. Since the number of the errors exceeds the error-correctable bit number of the in-memory error correction circuit 420, an error of one bit is increased by the error correction operation of the in-memory error correction circuit 420. It may be seen from FIG. 5B that the errors of four bits are included in the same symbol as in FIG. 5A, and another error of one bit is included in another symbol due to the malfunction of the in-memory error correction circuit 420.

The error correction operation of the in-memory error correction circuit 420 may cause an error in the operation of the memory system 300. In FIG. 5A, since the errors are in one symbol, the errors may be corrected by the error correction operation of the error correction circuit 312. However, in FIG. 5B, since the errors are in two symbols, the errors cannot be corrected even by the error correction operation of the error correction circuit 312. In other words, due to the error correction operation of the in-memory error correction circuit 420, it is no longer possible to correct, even by the error correction circuit 312, errors which may otherwise be corrected when there is no error correction operation of the in-memory error correction circuit 420.

Figure 6:
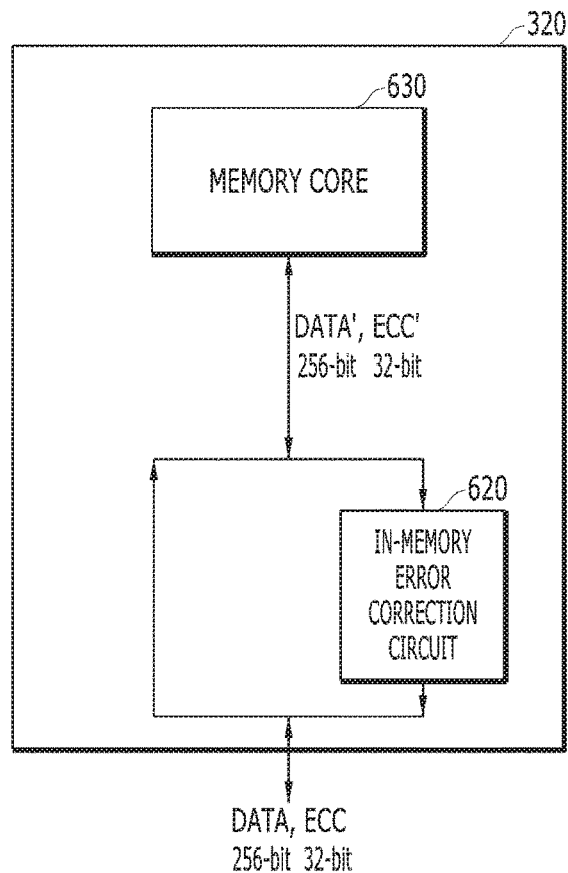
FIG. 6 is a diagram illustrating a configuration of the memory device 320 shown in FIG. 3.

FIG. 6 is a diagram illustrating a configuration of the memory device 320 shown in FIG. 3. In FIG. 6, only components directly associated with storage of data and error correction of data in the memory device 320 are shown.

Referring to FIG. 6, the memory device 320 may include an in-memory error correction circuit 620 and a memory core 630.

The memory device 320 of FIG. 6 does not include an in-memory error correction code generation circuit, unlike the memory device 320 FIG. 3. Therefore, in this embodiment, an in-memory error correction code ECC_IN_MEMORY does not exist. Thus, the in-memory error correction code ECC_IN_MEMORY is not stored in the memory core 630. However, the data DATA' and the error correction code ECC' may be stored in the memory core 630. In the write operation, since the error correction operation is not performed, the data DATA and the data DATA' may be the same, and the error correction code ECC and the error correction code KC' may be the same.

The memory core 630 may store the data DATA' and the error correction code ECC' in the memory device 320. The memory core 630 may include a plurality of cell arrays and circuits for writing the data DATA' and the error correction code KC' in the plurality of cell arrays, and for reading the data DATA' and the error correction code ECC' from the plurality of cell arrays.

The in-memory error correction circuit 620 may correct an error of the data DATA' by using the error correction code ECC' read from the memory core 630. Since the in-memory error correction circuit 620 uses the same error correction code ECC' as the error correction circuit 312 of the memory controller 310, the in-memory error correction circuit 620 may be designed to have the same error correction capability as the error correction circuit 312. However, in this case, because an error correction time is markedly increased, it is difficult for the error correction operation of the memory device 320 to be performed in a hidden state. Therefore, the in-memory error correction circuit 620 may be designed to have lower error correction capability than the error correction circuit 312. Namely, when the error correction circuit 312 has error correction capability of maximum M bits, the in-memory error correction circuit 620 may be designed to have error correction capability of maximum N bits. Both N and M may be integers of 1 or more, and M>N. Further, the in-memory error correction circuit 620 may perform the error correction operation only in the case where a specific condition is met. For example, the in-memory error correction circuit 620 may perform the error correction operation only in the case where a detected error is between one bit and N bits inclusive, i.e., 1 bit≤detected error≤N bits. In the further explanation given below, it is assumed, as an example, that N is 1 and M is 16, that is, 1 symbol.

The in-memory error correction circuit 620 may check the presence of an error through performing a CRC calculation by using the CRC code of 16 bits in the error correction code ECC'. Then, after performing a parity calculation by using the simple parity code of 16 bits in the error correction code KC', it may be confirmed that an error of one bit is present, in the case where the number of 1-bit errors, among 16 bits, is 1 as a result of the calculation. That is to say, (1) the presence of an error may be confirmed through the CRC calculation, and (2) it may be confirmed as a result of the parity calculation that the number of 1-bit errors is 1. In the case where both (1) and (2) are satisfied, the in-memory error correction circuit 620 may correct the error of one bit by using the CRC code. While it is described above that the CRC code is a CRC-16 code, since the CRC-16 code is also an SECDED (single error correction and dual error detection) code, the error of one bit may be corrected by using the CRC code. In the case where the number of 1-bit errors is 0 as a result of performing the parity calculation again after performing the correction operation as described above, it may be confirmed that the correction operation for the error of one bit was correctly performed. In the case where the number of 1-bit errors is not 0 as a result of performing the simple parity calculation again after performing the correction operation for the error of one bit by using the CRC-16 code, since the assumption of an 1-bit error is wrong, the correction operation may be canceled, and the data DATA of 256 bits and the error correction code ECC of 32 bits may be outputted.

The data DATA and error correction code ECC in which an error is corrected or not corrected by the in-memory error correction circuit 620 may be transferred from the memory device 320 to the memory controller 310.

In the memory system 300 configured as shown in FIGS. 3 and 6, the in-memory error correction circuit 620 uses the same error correction code ECC as the error correction circuit 312. Only an error which is correctable by the in-memory error correction circuit 620 is corrected. Therefore, a problem of the error correction capability of the error correction circuit 312 becoming deteriorated by the malfunction of the in-memory error correction circuit 620 is avoided. Since most errors occurring in the memory system 300 are small errors such as 1-bit errors, they may be corrected by the in-memory error correction circuit 620. The error correction circuit 312 may correct large errors which occur infrequently.

Figure 7:
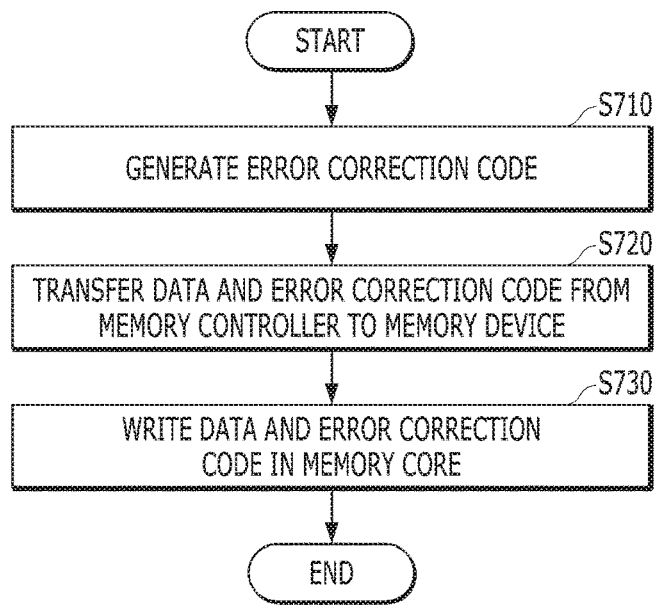
FIG. 7 is a flow chart describing a write operation of the memory system 300 configured as shown in FIGS. 3 and 6.

FIG. 7 is a flow chart describing a write operation of the memory system 300 configured as shown in FIGS. 3 and 6.

Referring to FIG. 7, the error correction code generation circuit 311 of the memory controller 310 may generate the error correction code ECC by using the data HOST_DATA transferred from the host (S710). The data HOST_DATA may be 256 bits, and the error correction code ECC may be 32 bits. 16 bits among the 32 bits of the error correction code ECC may be the CRC code, and the remaining 16 bits may be the simple parity code.

The memory controller 310 may transfer the data DATA and the error correction code ECC to the memory device 320 (S720). The memory device 320 may write the data DATA' and the error correction code KC' in the memory core 630 (S730).

In the write operation, the error correction code ECC is generated in the memory controller 310, and the memory device 320 may store the data DATA and the error correction code ECC received therein.

Figure 8:
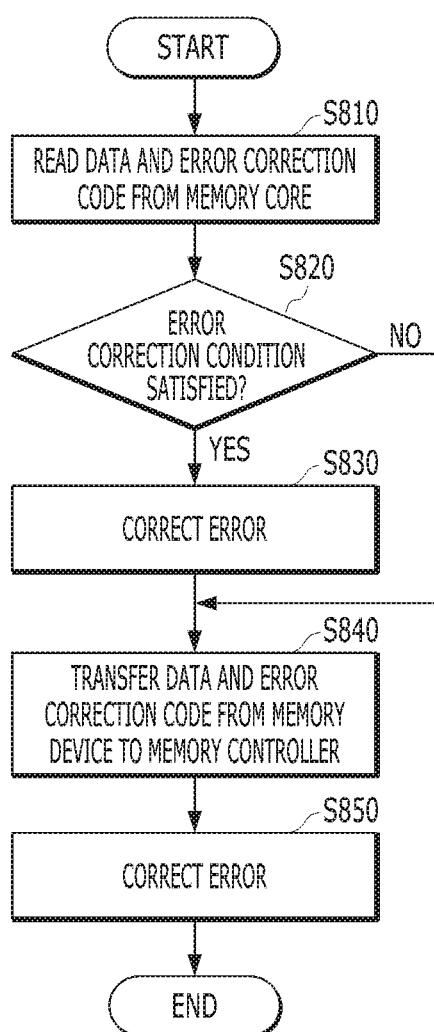
FIG. 8 is a flow chart describing a read operation of the memory system 300 configured as shown in FIGS. 3 and 6.

FIG. 8 is a flow chart describing a read operation of the memory system 300 configured as shown in FIGS. 3 and 6.

Referring to FIG. 8, the data DATA' and the error correction code ECC' may be read from the memory core 630 of the memory device 320 (S810).

The in-memory error correction circuit 620 of the memory device 320 may check whether an error correction condition is satisfied, by using the error correction code ECC' (S820). In other words, the in-memory error correction circuit 620 may check whether an error is one bit or not. The in-memory error correction circuit 620 may check (1) whether an error is present or not, through a CRC calculation, and may check (2) whether the number of 1-bit errors is 1, as a result of a parity calculation. In the case where both (1) and (2) are satisfied, the in-memory error correction circuit 620 may confirm that an error is one bit.

In the case where the error correction condition is satisfied (Y at the step S820), the in-memory error correction circuit 620 may correct an error of the data DATA' by using the error correction code KC' (S830). In the case where the error correction condition is not satisfied (N at the step S820), the error correction operation at the step S830 may be skipped.

Thereafter, the data DATA and the error correction code ECC may be transferred from the memory device 320 to the memory controller 310 (S840).

Then, the error correction circuit 312 of the memory controller 310 may correct an error of the data DATA by using the error correction code ECC (S850). No error is present in the data DATA in most cases, and even when a small error is present in the data DATA, it is corrected at the step S830. Thus, a large error of the data DATA may be corrected at the step S850.

Figure 9:
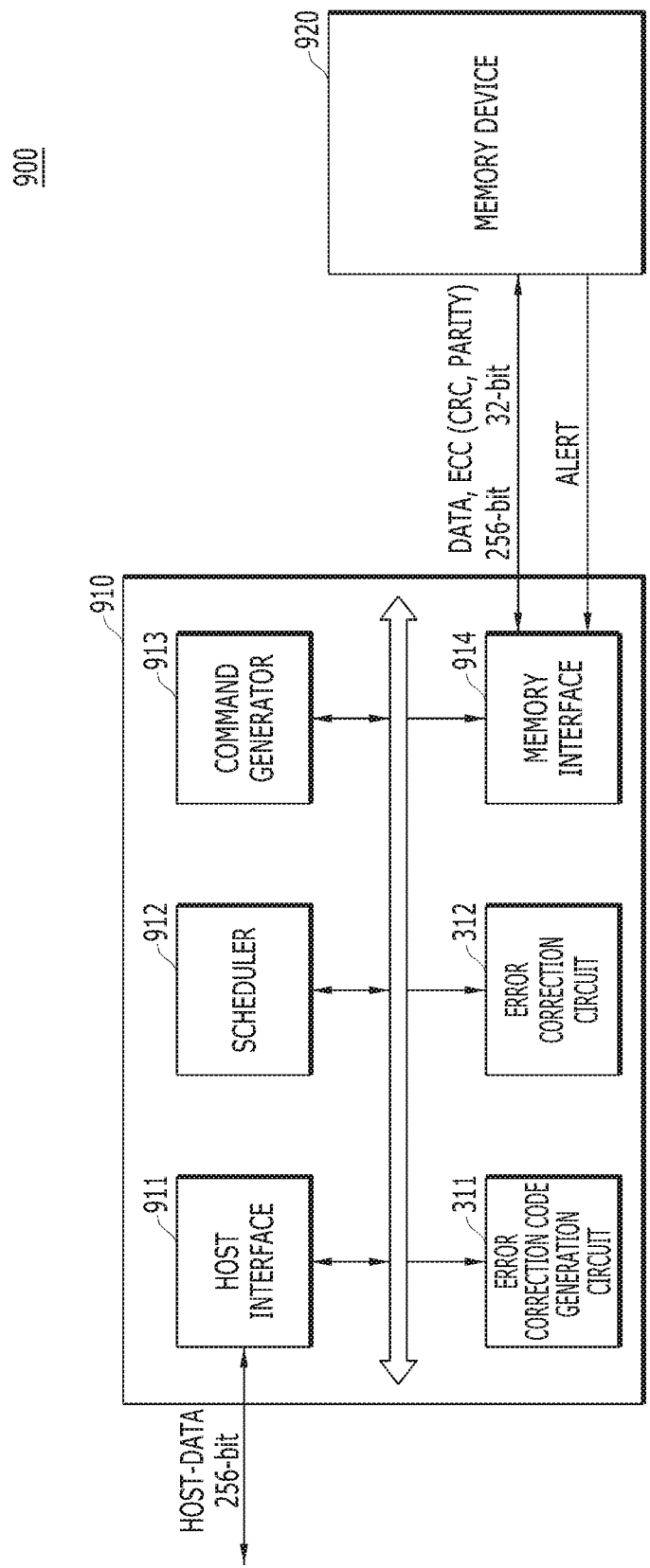
FIG. 9 is a diagram illustrating a configuration of a memory system 900 in accordance with another embodiment.

FIG. 9 is a diagram illustrating a configuration of a memory system 900 in accordance with another embodiment.

Referring to FIG. 9, the memory system 900 may include a memory controller 910 and a memory device 920.

The memory controller 910 may control the read and write operations of the memory device 920 depending on a request of a host. The memory controller 910 may include an error correction code generation circuit 311, an error correction circuit 312, a host interface 911, a scheduler 912, a command generator 913 and a memory interface 914.

The error correction code generation circuit 311 and the error correction circuit 312 may be designed and operate in the same manner as described above in the embodiment of FIG. 3.

The host interface 911 may be to interface the memory controller 910 and the host. Through the host interface 911, requests of the host may be received and processing results of the requests may be transmitted to the host. While various information may be transmitted and received between the memory controller 910 and the host through the host interface 911, only data HOST_DATA directly associated with the present disclosure is shown in FIG. 9.

The scheduler 912 may determine the sequence of requests to be issued to the memory device 920, among requests from the host. The scheduler 912 may differentiate between a sequence in which requests are received from the host and a sequence of operations to be performed by the memory device 920, to improve the performance of the memory device 920. For example, even though the host first requests a read operation of the memory device 920 and then requests a write operation of the memory device 920, the scheduler 912 may adjust a sequence such that the write operation is performed earlier than the read operation. After the scheduler 912 instructs the memory device 920 to perform the write operation, in the case where it is notified from the memory device 920 that an error is present in write data, the scheduler 912 may schedule the corresponding write operation to be performed again.

The command generator 913 may generate commands to be applied to the memory device 920, in conformity with the sequence of operations that is determined by the scheduler 912.

The memory interface 914 may interface the memory controller 910 and the memory device 920. Through the memory interface 914, a command and an address may be transferred from the memory controller 910 to the memory device 920 and data may be transmitted/received. The memory interface 914 may also be referred to as a PHY interface. In FIG. 9, only data DATA, an error correction code ECC (CRC and PARITY) and an alert signal ALERT, which are directly associated with the present disclosure, among the various information transmitted and received between the memory controller 910 and the memory device 920, is shown.

The memory device 920 may store the entirety of the codeword of 288 bits including the data DATA and the error correction code ECC, that is, the codeword of 18 symbols. The entirety of the 18 symbols configuring the codeword may be stored in the memory device 920 in one write operation. The entirety of the 18 symbols may be read from the memory device 920 in one read operation. The memory device 920 may be a high bandwidth memory (HBM), and also has a density higher than usual. Thus, the HBM is a kind of memory configured in that memory chips are stacked based on a 3D-TSV technology and an increased number of data pins are disposed to increase I/O bandwidth. In the case of the HBM, an entire codeword corresponding to one write command may be written in one memory device in a write operation, and an entire codeword corresponding to one read command may be read from one memory device in a read operation. In the memory system 900 of FIG. 9, an entire codeword is written in one memory device 920 and an entire codeword is read from one memory device 920. Besides the HBM, other kinds of memories may be used as the memory device 920 of the memory system 900 so long as they satisfy such a condition.

Figure 10:
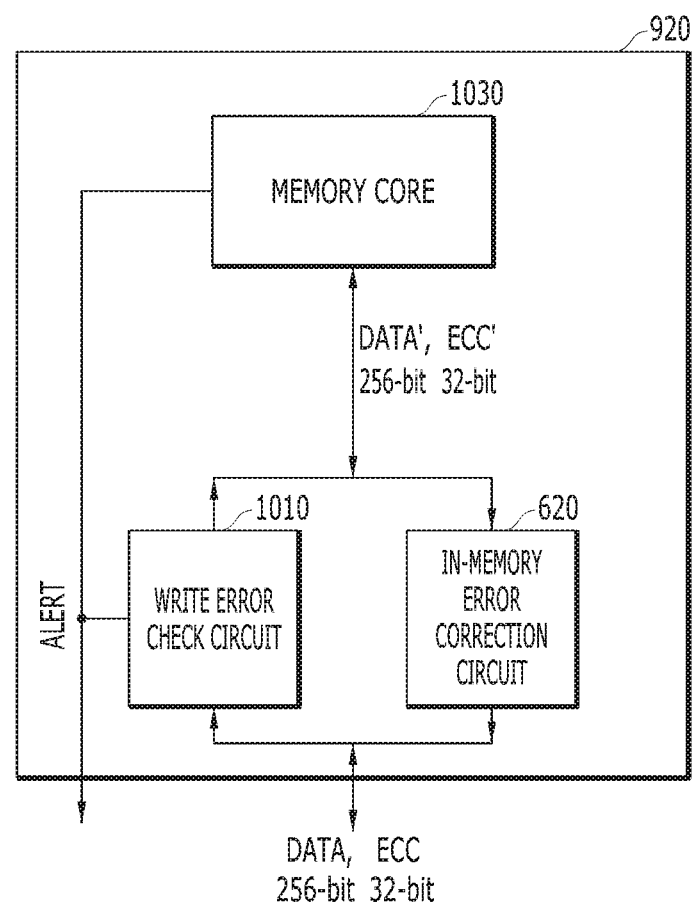
FIG. 10 is a diagram illustrating a configuration of the memory device 920 shown in FIG. 9.

FIG. 10 is a configuration diagram illustrating a representation of an example of the memory device 920 shown in FIG. 9. In FIG. 10, only components directly associated with storage of data and error correction of data in the memory device 920 are shown.

Referring to FIG. 10, the memory device 920 may include an in-memory error correction circuit 620, a write error check circuit 1010 and a memory core 1030.

The write error check circuit 1010 may detect an error of the data DATA received from the memory controller 910, by using the error correction code ECC received from the memory controller 910, in the write operation. A CRC code is included in the error correction code ECC, and may be used for determining whether an error is present. In the case where an error is present in the data DATA as a result of error detection, the write error check circuit 1010 may activate the alert signal ALERT. If the alert signal ALERT is activated, the write operation may not be performed in the memory core 1030. The alert signal ALERT may be transferred to the memory controller 910. In the case where an error is not present in the data DATA as a result of the error detection of the write error check circuit 1010, the data DATA and the error correction code ECC may be written in the memory core 1030.

In the write operation, since an error correction operation is not performed, the data DATA and data DATA' may be the same, and the error correction code ECC and an error correction code ECC' may be the same.

The memory core 1030 may store the data DATA' and the error correction code ECC' in the memory device 920. The memory core 1030 may include a plurality of cell arrays and circuits for writing the data DATA' and the error correction code KC' in the plurality of cell arrays and for reading the data DATA' and the error correction code ECC' from the plurality of cell arrays. In the case where the alert signal ALERT is activated in the write operation, the data DATA' and the error correction code ECC' may not be written in the memory core 1030.

The in-memory error correction circuit 620 may be designed and operate in the same manner as in FIG. 6. In other words, the in-memory error correction circuit 620 may correct an error by using the error correction code ECC only in the case where an error detected by using the error correction code ECC is between one bit and N bits inclusive.

In the memory device 920 of FIG. 10, in the case where it is determined by the write error check circuit 1010 that an error is present, the write operation is not performed and thus it is possible to prevent an error from occurring subsequently.

Figure 11:
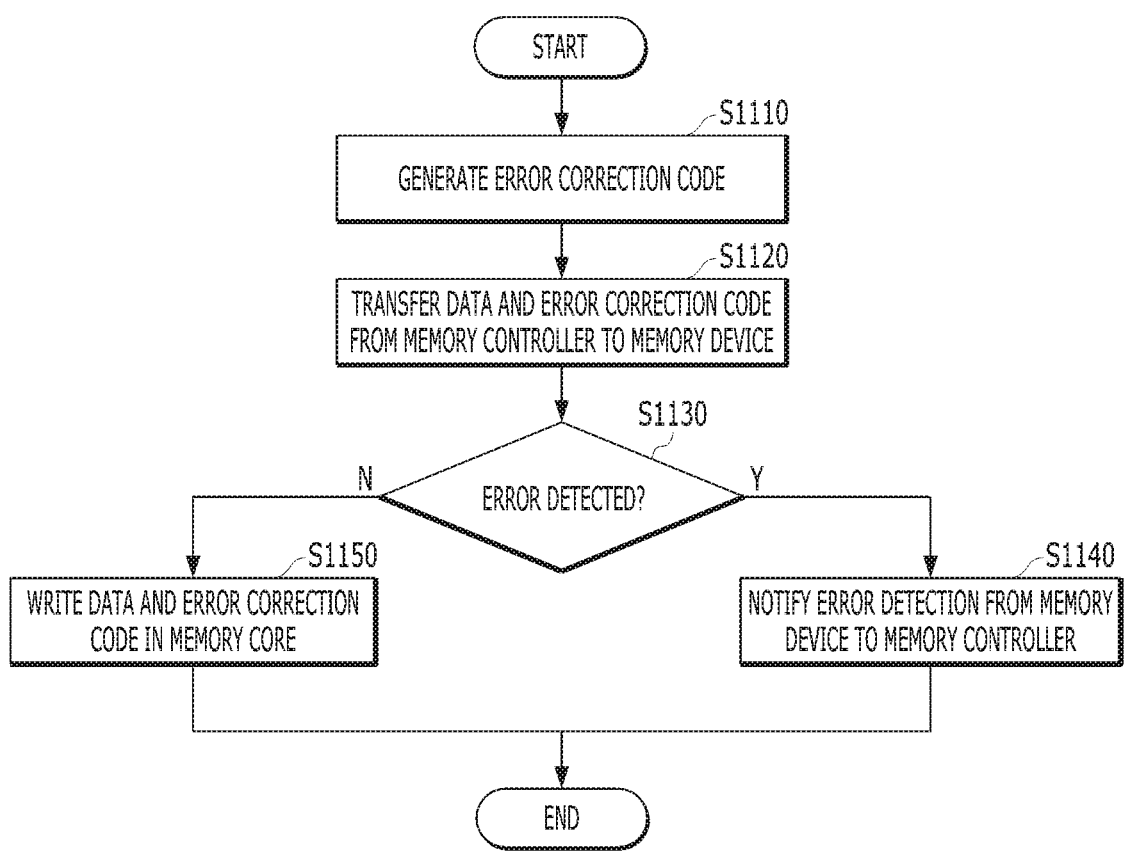
FIG. 11 is a flow chart describing a write operation of the memory system 900 shown in FIG. 9.

FIG. 11 is a flow chart to assist in the explanation of a write operation of the memory system 900 shown in FIG. 9.

Referring to FIG. 11, the error correction code generation circuit 311 of the memory controller 910 may generate the error correction code ECC by using the data HOST_DATA transferred through the host interface 911 from the host (S1110). The data HOST_DATA may be 256 bits, and the error correction code ECC may be 32 bits. 16 bits among the 32 bits of the error correction code ECC may be the CRC code, and the remaining 16 bits may be the simple parity code.

The memory controller 910 may transfer the data DATA and the error correction code ECC to the memory device 920 (S1120). The data DATA and the error correction code ECC may be transferred to the memory device 920 through the memory interface 914.

The write error check circuit 1010 of the memory device 920 may detect an error of the data DATA by using the error correction code ECC (S1130).

In the case where an error is detected (Y at the step S1130), the write operation is not performed in the memory device 920. The fact that an error is detected may be transferred from the memory device 920 to the memory controller 910 (S1140). After the indication that an error is detected is transferred to the memory controller 910, the corresponding write operation may be ended. The scheduler 912 of the memory controller 910, which is notified that an error is detected, may schedule again the write operation that is not performed. The memory controller 910 may newly instruct the same write operation to the memory device 920. In this case, the operations of FIG. 11 may be performed again.

In the case where an error is not detected (N at the step S1130), the data DATA' and the error correction code ECC' may be written in the memory core 1030 (S1150).

Since the read operation of the memory system 900 may be performed in the same manner as in FIG. 8, detailed description thereof is omitted here.

According to the embodiments, error correction efficiency in a memory system may be improved or enhanced.

Although various embodiments have been described and illustrated, it will be apparent to those skilled in the art in light of the foregoing disclosure that various changes and modifications may be made without departing from the spirit and scope of the invention as defined in the following claims.

What is claimed is:

1. A memory device comprising:
    a write error check circuit suitable for detecting an error in received data, transferred from a memory controller, using a received error correction code, transferred from the memory controller, during a write operation; and
    a memory core suitable for storing the received data and the received error correction code that is used for detecting the error in the received data when no error is detected by the write error check circuit,
    wherein, when an error in the received data is detected by the write error check circuit during the write operation, the received error correction code and the received data are not stored in the memory core.

2. The memory device according to claim 1, further comprising:
    an in-memory error correction circuit suitable for, during a read operation, checking for an error in data read from the memory core using the error correction code read from the memory core, and correcting the error in the read data using the read error correction code when the error in the read data is between one bit and N bits inclusive, where N is an integer of 1 or more.

3. The memory device according to claim 2, wherein a maximum bit number of an error that is correctable using the error correction code is M bits, where M is an integer greater than N.

4. The memory device according to claim 2, wherein the error correction code includes a cyclic redundancy check (CRC) code and a simple parity code.

5. The memory device according to claim 2, wherein the memory device is a high bandwidth memory (HBM).

6. The memory device according to claim 1,
    wherein, when an error in the received data is detected by the write error check circuit, the memory device notifies a memory controller that the error is detected.

7. A memory system including a memory device and a memory controller,
    the memory device comprising:
    a write error check circuit suitable for detecting an error in data, received from the memory controller using an error correction code received from the memory controller during a write operation; and
    a memory core suitable for storing the received data and the received error correction code that is used for detecting the error in the data when no error is detected by the write error check circuit,
    the memory controller comprising:
    an error correction code generation circuit suitable for generating the error correction code to be transferred to the memory device using the data to be transferred to the memory device; and
    an error correction circuit suitable for correcting, when an error is present in data transferred from the memory device, the error in the data transferred using an error correction code transferred from the memory device,
    wherein, when an error in the received data is detected by the write error check circuit during the write operation, the received error correction code and the received data are not stored in the memory core.

8. The memory device according to claim 7, wherein the memory device further comprises:
    an in-memory error correction circuit suitable for, during a read operation, checking for an error in data read from the memory core using an error correction code read from the memory core, and correcting the error in the read data using the read error correction code when the error in the read data is between one bit and N bits inclusive, where N is an integer of 1 or more.

9. The memory device according to claim 8, wherein the error correction circuit has error correction capability of M bits, where M is an integer greater than N.

10. The memory device according to claim 7,
    wherein, when an error in the received data is detected by the write error check circuit, the received error correction code and the received data are not stored in the memory core, and
    wherein the memory device notifies the memory controller that the error is detected.

11. The memory device according to claim 7, wherein the memory device writes a codeword corresponding to one write command, and reads a codeword corresponding to one read command.

12. The memory device according to claim 7, wherein the memory device is a high bandwidth memory (HBM).

13. The memory device according to claim 7, wherein the error correction code includes a cyclic redundancy check (CRC) code and a simple parity code.

14. A method for operating a memory system, comprising:
    generating, by a memory controller, an error correction code using write data;
    transferring a write command, the write data, and the error correction code to a memory device from the memory controller;
    detecting, by the memory device, an error in the write data using the error correction code;
    storing, when no error in the write data is detected, the write data and the error correction code that is used for detecting the error in the write data, in a memory core of the memory device; and not performing a write operation by the memory device and notifying the memory controller that an error in the write data is detected, when the error in the write data is detected.

15. The method according to claim 14, further comprising:
transferring a read command from the memory controller to the memory device;
reading data and an error correction code from the memory core of the memory device;
detecting, by the memory device, an error in the data read from the memory core using the error correction code read from the memory core;
correcting, when the error in the read data is between one bit and N bits inclusive, where N is an integer of 1 or more, the error in the read data using the read error correction code, and transferring error-corrected data and the read error correction code to the memory controller from the memory device;
transferring, when no error is detected in the read data or the error in the read data exceeds N bits, the read data and the read error correction code to the memory controller from the memory device; and
correcting, by the memory controller, when an error is present in the data transferred from the memory device, the error in the data transferred using the error correction code transferred from the memory device.

16. The method according to claim 15, wherein the memory controller has error correction capability of M bits, where M is an integer greater than N.

17. The method according to claim 15, wherein the write data and the error correction code transferred to the memory device are an entire codeword corresponding to the write command transferred to the memory device.

18. The method according to claim 14, wherein the error correction code includes a cyclic redundancy check (CRC) code and a simple parity code.

19. The method according to claim 14, wherein the memory device is a high bandwidth memory (HBM).

* * * * *